(12) United States Patent
Poetzinger et al.

(10) Patent No.: US 9,618,534 B2
(45) Date of Patent: Apr. 11, 2017

(54) GUIDE AND SUPPORT MEMBER FOR A DEVICE FOR TESTING ELECTRONIC COMPONENTS

(71) Applicant: MULTITEST ELEKTRONISCHE SYSTEME GMBH, Rosenheim (DE)

(72) Inventors: Johann Poetzinger, Fischbachau (DE); Gerald Staniszewski, Neubeuern (DE); Simon Kronthaler, Niederndorf (AT)

(73) Assignee: Multitest Elektronische Systeme GmbH, Rosenheim (DE)

( * ) Notice: Subject to any disclaimer, the term of this patent is extended or adjusted under 35 U.S.C. 154(b) by 91 days.

(21) Appl. No.: 14/720,545

(22) Filed: May 22, 2015

(65) Prior Publication Data

US 2015/0338440 A1 Nov. 26, 2015

(30) Foreign Application Priority Data

May 23, 2014 (DE) .......................... 10 2014 107 314

(51) Int. Cl.
*G01R 1/04* (2006.01)
*G01R 31/26* (2014.01)
*G01R 31/28* (2006.01)

(52) U.S. Cl.
CPC ............ *G01R 1/0408* (2013.01); *G01R 31/26* (2013.01); *G01R 31/2603* (2013.01); *G01R 31/2867* (2013.01)

(58) Field of Classification Search
None
See application file for complete search history.

(56) References Cited

U.S. PATENT DOCUMENTS 5,927,503 A * 7/1999 Nevill .............. H01L 21/67333
                                              206/560
7,362,117 B2 * 4/2008 Saito .................... G01R 1/0458
                                              324/750.09

FOREIGN PATENT DOCUMENTS

DE    10 2008 025 688 A1    12/2009

OTHER PUBLICATIONS

English Translation of DE 10 2008 025 688 A1 by Staniszewski, Dec. 2009.*

* cited by examiner

*Primary Examiner* — Paresh Patel
(74) *Attorney, Agent, or Firm* — Lewis Roca Rothgerber Christie LLP

(57) ABSTRACT

Embodiments of the invention come up from a guide and support member within a device for testing electronic components, which guide and support member can be moved into a feeding position and into a testing position, the guide and support member with a base body for accommodating an electronic component to be tested, with at least one support for supporting contact springs of the electronic component to be tested, and with at least one stopper that stops the movement of the electronic component to be tested at one of its contact springs once the electronic component to be tested is in an exact position. According to the invention, the at least one support comprises a ceramic material, wherein the stopper is anchored in the base body.

16 Claims, 2 Drawing Sheets

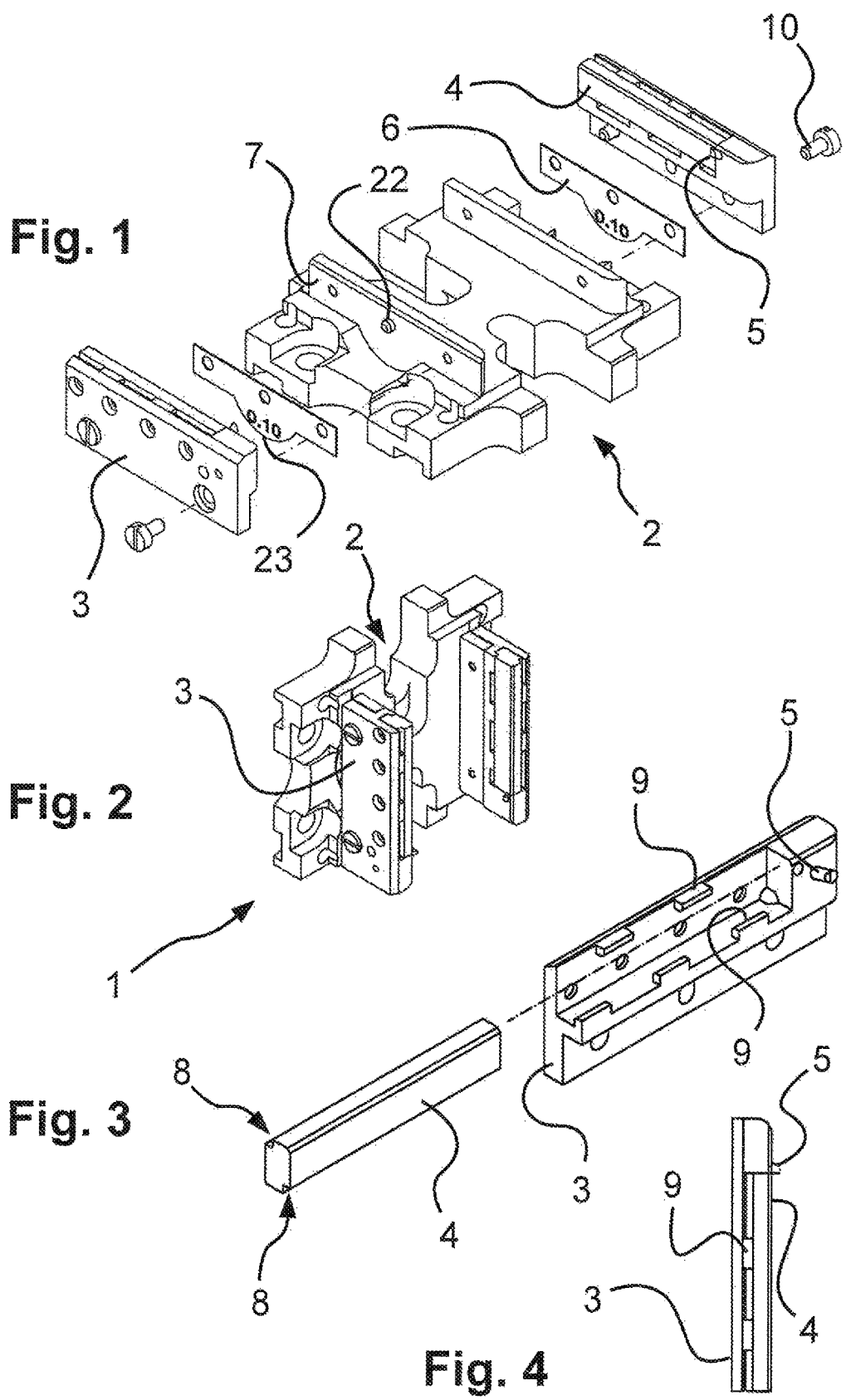

GUIDE AND SUPPORT MEMBER FOR A DEVICE FOR TESTING ELECTRONIC COMPONENTS

CROSS REFERENCE TO RELATED APPLICATION

Figure 5:
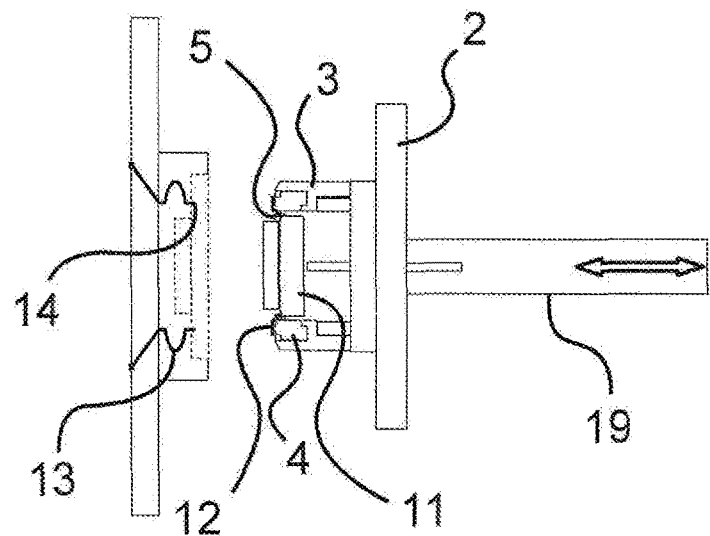

This application claims priority to and the benefit of the filing date of the German Patent Application No. 10 2014 107 314.2 filed 23 May 2014 the disclosure of which is hereby incorporated herein by reference.

TECHNICAL FIELD

Embodiments of the invention relates to a guide and support member in a device for testing electronic components.

TECHNOLOGICAL BACKGROUND

So-called gravity handlers have become known for testing electronic components. As is known, these gravity handlers comprise guide channels in which the electronic components to be tested slide downward under the force of gravity, until they are stopped by a separating device.

The guide channels are usually designed in such a way as to guide the electronic components to be tested between guide elements arranged parallel with respect to each other, wherein the contact springs of the electronic components to be tested, which contact springs protrude over the electronic components to be tested on opposing sides, extend through a respective gap at the two sides of a guide element.

Under the separating device there is usually located a guide and support member, a so-called lead backer, which can be moved at least into a feeding position and into a testing position. For this purpose, the lead backer can be shifted perpendicular to the guide channel.

The electronic components to be tested are individually fed to the lead backer via the separating device. The electronic components to be tested are there positioned by at least one stopper, a so-called stopper pin. The stopper pin serves as a stop for one of the contact springs, so that the whole electronic component to be tested is held in the correct position at this contact spring or these contact springs.

The lead backer can be moved into the testing position together with the electronic component to be tested by means of a stamp. In the testing position, the contact springs of the electronic components to be tested are pressed against the test springs of a test socket, thereby establishing a reliable electrical contact between the contact springs of the electronic component to be tested and the test springs of the test socket. The test springs of the test socket are electrically connected with a test head in the form of an electronic computing device. Via the electronic computing device the various tests are then initiated, by means of which the electronic components are supposed to be tested.

In order to prevent the contact springs of the electronic components to be tested from being bent by the test springs of the test socket during the test, the lead backer comprises special supports by means of which the contact springs of the electronic components to be tested are supported. As a consequence, the function of this type of lead backer is in particular to guide and support an electronic component to be tested and its contact springs while the electronic component is moved towards the test socket, made to contact with the test socket and again moved away from the test socket.

The problem with lead backers is that the supports for supporting the contact springs of the electronic components to be tested close rapidly owing to the sharp edges of the contact springs. A defined position of the contact springs can then no longer be reached during the test. This implies a poor or at least non-reproducible contact between the contact springs and test springs, and can even result in a bending of the contact springs, and thus in damage to the electronic component to be tested.

A lead backer for a gravity handler is known from DE 10 2008 025 688 A1, wherein the lead backer comprises pins. Further, at least one spacer plate is provided, which can be arranged between partition walls of a socket and support elements which are detachably mounted to the partition walls. By varying the thickness of the spacer plates the lead backer can be used for different semiconductor components.

SUMMARY OF THE INVENTION

There may be a need to design a guide and support member in a device for testing electronic components in such a way that the service life of the supports can be extended, without appreciably increasing the costs of their manufacture.

This need may be achieved according to embodiments of the invention by means of a guide and support member in a device for testing electronic components with the features in claim 1. In particular, the object can be achieved by a guide and support member in a device for testing electronic components that can be moved into a feeding position and into a testing position, the guide and support member with a base body for accommodating an electronic component to be tested, with at least one support for supporting contact springs of the electronic component to be tested, and with at least one stopper that stops the movement of the electronic component to be tested at one of its contact springs once the electronic component to be tested is in an exact position, wherein the at least one support comprises a ceramic material and is inserted into a channel-shaped receptacle of an attachment module of the base body, and wherein that the stopper is anchored in the base body. Because the at least one support consists of a ceramic material or comprises the latter, an extremely hard and wear-resistant surface can be obtained, which cannot be damaged even by the sharp edges of the contact springs of the electronic components to be tested. As a result, a very long service life can be achieved for the guide and support member. In order to keep manufacturing costs at an acceptable level, the stopper can be anchored in the base body, preferably in combination. This may make it possible to keep the shape of the ceramic support very simple, without having to adjust it in complicated grinding processes. By contrast, the stopper can be easily and inexpensively positioned and shaped, since the stopper is not part of the ceramic support.

Additional details and advantages of embodiments of the invention may be gleaned from the dependent claims.

Metal materials are usually used in order to enable a stable attachment of the base body. On the other hand, however, the stopper should also be made from metal material, since metal can be readily machined, thereby enabling an easy adjustment. Metal is also resistant enough not to be worn down even by a large number of electronic components to be tested. However, a metal base body and a metal stopper attached thereto would pose the problem that currents would be discharged from the adjoining contact springs of the electronic components via the stopper and base body during the test. For this reason, the base body advantageously may comprise a base and at least one attachment module made from an electrically insulating plastic for the at least one support.

The stopper may be advantageously anchored in the at least one attachment module. This means that no current can flow from the contact springs of the component to be tested into the base body, since the plastic of the attachment module produces an electrical insulation between the stopper and the base. On the other hand, the stopper may not have to be attached to the support itself. For this reason, the stopper may comprise a simple shape that is cost effective to manufacture.

However, there may also be a variant in which the attachment module is also made from metal. In this case, the stopper itself should consist of a nonconductive, resistant material, or be insulated from the attachment module by an insert shell comprised of a nonconductive material.

It may be especially advantageous that the stopper is aligned in such a way that the adjoining contact spring of the electronic component to be tested is supported by the at least one support. The stopper can be readily designed as a metal pin, which is anchored in a bore in the attachment module. The bore advantageously forms an angle with the surface that differs from 90°, so that the free end of the metal pin protruding from the inclined bore extends until over the surface of the support. As a result, a contact spring adjoining this free end of the metal pin is still located over the hard surface of the ceramic support, and not over the soft plastic of the attachment module.

For example, the support could be screwed or riveted to the attachment module. However, such a type of attachment would complicate the shape of the support, and also run the risk of damage being done to the brittle support during assembly. Therefore, the at least one support may be joined in a positive fit manner with the at least one attachment module by imparting a very simple shape to the support and attachment module.

If no direct latching is desired between the support and attachment module, the positive fit can be structurally configured so as to insert the support into a corresponding receptacle in the attachment module. For example, the one remaining degree of freedom in the direction of insertion can be eliminated through tight guidance by way of a frictional connection. However, it may be especially advantageous for the at least one support to also be adhesively bonded with the at least one attachment module.

The positive fit between the support and attachment module should be as simple in design as possible, and in particular not necessitate imparting a complicated shape to the ceramic support. For this reason, the positive fit may be established via two seams on diagonally opposing longitudinal edges of the at least one support, and via springs of the at least one attachment module.

In a completely assembled guide and support member, all regions that can be touched by the contact springs of the components to be tested should not consist of soft plastic, but of hard ceramic. Only this ensures that the service life can be correspondingly extended in comparison to a plastic support. For this reason, the height of the seam may be advantageously given larger dimensions than the height of the spring.

A chamfer or some other advantageous shape along the longitudinal edge of the at least one support yields a more exact support for the electrical component to be tested. These regions of the at least one support comprise a varying diagonal design, so that, depending on the type of electronic component to be tested, the at least one support can be incorporated into the attachment module in a symmetrical or mirrored manner using adhesives or other bonds.

DETAILED DESCRIPTION OF EXEMPLARY EMBODIMENTS

Additional details and advantages of embodiments of the invention result from the description of an exemplary embodiment, which is explained in depth based on the drawing.

Figure 6:
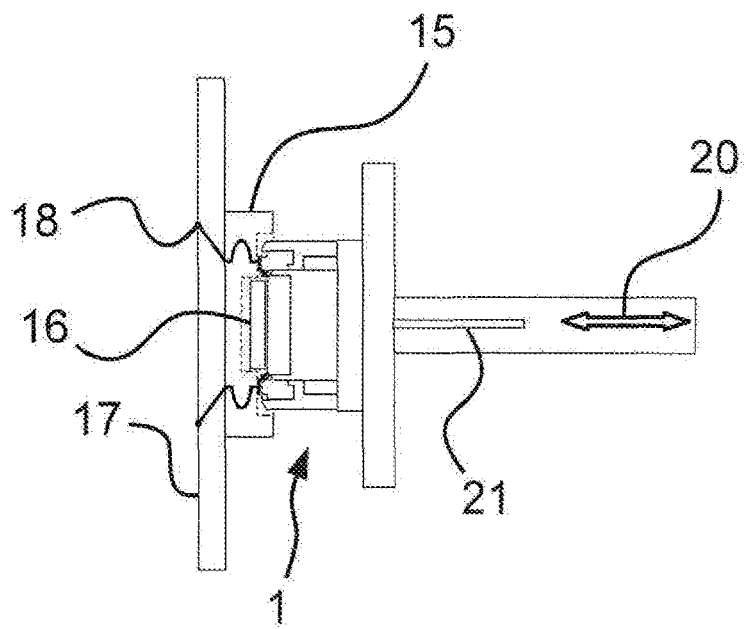
Figure 7:
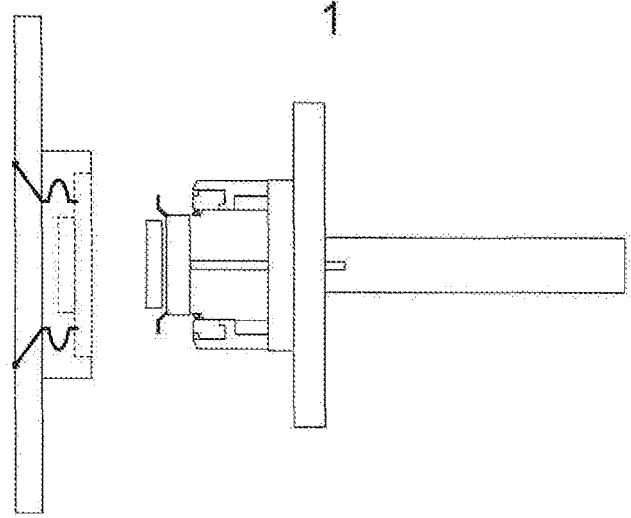

Shown in:

FIG. 1 is an exploded view of a guide and support member according to an embodiment of the invention, FIG. 2 is the completely assembled guide and support member according to FIG. 1, FIG. 3 is an attachment module with support in an exploded view, FIG. 4 is a top view of the completely assembled attachment module according to FIG. 3, FIG. 5 is a schematic view of a testing device with the guide and support member in the feeding position, FIG. 6 is the testing device according to FIG. 5 in the testing position, and FIG. 7 is the testing device according to FIGS. 5 and 6 in the ejecting position.

The guide and support member according to an embodiment of the invention will here be explained based on the example of a lead backer of the kind that can be used in so-called gravity handlers. As can be seen from FIGS. 1 to 4, the lead backer 1 essentially consists of a base body with a base 2 and two attachment modules 3.

The attachment modules 3 each have a receptacle for the supports 4. In addition, spacer plates 6 are mounted between the base 2 and attachment modules 3, so that the distance of the supports 4 can be precisely adjusted to the electronic components to be tested.

The base 2 comprises two coupling flanges 7, to which the attachment modules 3 are attached with the help of screws 10. To this end, two threaded holes are provided in each of the coupling flanges 7, and two holes concentric to the threaded holes are provided in each of the attachment modules 3.

A centrally arranged centering bolt 22 is provided at each coupling flange 7. The spacer plate 6 can be plugged on the centering bolt 22. To this end, the spacer plate 6 comprises an opening not specified in any greater detail, through which the centering bolt 22 can extend. The centering bolt 22 is used to easily assemble the spacer plates 6, and, together with the shape of the spacer plates 6 and the shape of the base 2 adjusted thereto, ensures that the spacer plates 6 are already situated in the correct position relative to the coupling flanges 7 before the attachment modules 3 are attached. The spacer plates 6 further comprise within the two opposing edge areas two bores, which align with the threaded bores of the coupling flange 7, so that the screws 10 can be passed through.

The spacer plates 6 comprise a lower, semicircular viewing region 23 that remains visible under the bolted attachment modules 3 after the lead backer 1 has been installed. In this way, the measured value displayed in the viewing region 23 remains readable even after assembly. The measured value indicates the thickness of the spacer plate 6, so that the distance of the two ceramic supports 4 can be determined even without a disassembly and without a precise measurement. In this way, the displayed measured value provides information about the types (widths) of electronic components 11 for which the lead backer 1 installed in this way can be used.

The attachment modules 3 incorporate a type of channel with a rectangular cross section for accommodating the ceramic supports 4. Two directly adjoining boundary walls of the channel are completely shaped by the attachment modules 3. The remaining two boundary walls are only formed by individual springs 9. In the region of the springs 9, the ceramic supports 4 each comprise a seam 8 along their longitudinal edges. The height of the springs 9 is kept somewhat lower than the height of the seam 8. This ensures that all regions that come into contact with an electronic component to be tested or its contact springs have a ceramic surface. This is guaranteed, since the surface of the attachment modules 3 made from plastic lies everywhere deeper than the surface of the ceramic supports 4.

The supports 4 are provided with a chamfer or some other shape adjusted to the shape of the contact springs 12 at a longitudinal edge between the two seams 8. This lowers the risk of damage to the contact springs 12 of the electronic components to be tested. Varying shapes can be provided at diagonally opposing longitudinal edges, so that the supports 4 can be mounted at the attachment modules 3 in two different positions. This enables an even better adjustment to varying components to be tested, without having to fabricate different supports 4.

In order to assemble the supports 4, the latter are pushed in a simple manner from the open side into the channel-shaped receptacles of the attachment modules. The supports 4 can also be adhesively bonded to secure the supports 4 in the channel-shaped receptacles of the attachment modules 3. However, it is also possible for a tight fit, and hence for a clamping, to limit the degree of freedom in the direction of insertion taken from the positive fit by the seam and springs. In this case, making a replacement becomes significantly easier given the necessity to replace the supports.

The so-called stopper pins 5 form a stop for exactly positioning the electronic components to be tested. These stopper pins 5 are advantageously made from metal, and are anchored in the attachment modules 3. They are secured at an inclination, so that the area forming the stop protrudes until above the support 4. In this way, the stopper pins 5 can be attached in the readily processable plastic of the attachment module 3, while still allowing the contact springs 12 to be held in the region of the hard ceramic support 4, and not damaging the softer plastic of the attachment module 3.

Even the exact positioning of the stopper pins 5 is more easily accomplished in the plastic than if the stopper pins were to be anchored directly in the ceramic material of the supports 4 or had to be integrated into the ceramic support 4 as a mold. The stopper pins 5 act directly on the front contact springs 12 of the electronic components 11 to be tested (as viewed in the direction of movement of the electronic components), and keep the latter in the exact position during the test. As a result, the ceramic supports 4 need not be precisely positioned in the direction of their longitudinal edges. Bolting the attachment modules 3 with the base 2 couples the position of the stopper pins 5 directly to the position of the lead backer 1, so that only the lead backer 1 has to be exactly positioned in the system.

The use and function of the lead backer 1 according to an embodiment of the invention will be described in the following based with reference to FIGS. 5 to 7.

The lead backer 1 can be regarded as a movable partial section of the gravity handler guide, in which the electronic components to be tested 11 slide downward under the force of gravity. Located above the lead backer 1 there is provided a separating device, which always allows only one electronic component to be tested 11 to slide into the lead backer 1.

However, there is also possible an embodiment in which the electronic components to be tested are not moved by gravity, but rather by a streaming fluid, such as air or some other gas, for example. In this case, the lead backer can be provided in any desired position. The focus will here be placed on a gravity handler with gravitational conveyance as the specification continues, however.

In the lead backer 1, the downwardly sliding electronic component 11 to be tested is stopped when the lower contact springs 12 hit the two stopper pins 5. The stopper pins 5 are adjusted in such a way that the electronic component 11 to be tested is now located in the correct position. This feeding position is depicted in FIG. 5. The electronic component 11 to be tested is held in the lead backer 1 by the retaining part 18, which is formed by a horizontally movable section of the guide.

The actual testing device comprises a test socket 15 and a so-called load board 16. The test springs 13 are arranged in the test socket 15. The test tips 14 of the test springs 13 are pre-stressed in the direction of the electronic component to be tested 11. The test socket 15 comprises a depression that accommodates the retaining part 18 during the test to an extent where the test tips 14 of the test springs 13 can rest on contact springs 12 of the electronic component to be tested.

The load board serves to relay the test signals from a test head (not shown here) to the test springs and in the reverse direction so as to relay the response signals of the electronic components 11 to be tested to the test head. The contact sockets 17 are provided for connecting the test head to the load board 16.

The base 2 of the lead backer 1 is attached to the stamp 19 that can move in the direction of the double arrow 20. Further provided is an ejector 21, which is immovably mounted. The free end of the ejector 21 extends through an opening in the base 2 of the lead backer 1 and, in the feeding position of the device, ends directly at the rear side of the electronic component 11 to be tested in the lead backer 1.

When an electronic component 11 to be tested is located in the correct position, the stamp 19 will move towards the left until the test tips 14 of the test springs 13 press against the contact springs 12 of the electronic component 11 to be tested. The retaining part 18 is here also moved, and pressed into the opening of the test socket 15 provided for this purpose. The electronic component 11 can now be tested. This test position is shown on FIG. 6.

After the test has been finished, the already tested electronic component must be conveyed further, and the lead backer 1 must be filled with the next electronic component to be tested. To this end, the stamp 19 pulls the lead backer 1 with the already tested electronic component back until it reaches the feeding position depicted on FIG. 5. Both the retaining part 18 and the electronic component participate in this movement.

The lead backer 1 is now pulled back even further by the stamp 19. In the process, the electronic component 11 hits the free end of the ejector 21, and can thus no longer continue to move together with the lead backer 1. Also the retaining part 18 is now not moving along as well.

The lead backer 1 is pulled back by the stamp 19 until the contact between the lower contact spring 12 of the electronic component 11 and the stopper pins 5 is lost. At this moment, the contact springs 12 are released, and the tested electronic component can continue to move downwardly and out from the lead backer, once again under the force of gravity.

This ejecting position is shown in FIG. 7. As soon as the lead backer 1 is free, it is again moved back into the feeding position depicted in FIG. 1 by the stamp, and ready to accommodate the next electronic component to be tested.

The ceramic supports 4 with their hard surface are subjected to hardly any wear, and must therefore only be changed out after long intervals. Since the stopper pins 5 are mounted not in the supports 4 themselves, but in the attachment modules 3, the supports 4 can be more easily replaced, without a readjustment being required thereafter. For the same reason, the supports 4 can also be cost effectively fabricated, since this case involves simple molds without any parts to be adjusted.

Of course, several test sockets with several guides and a corresponding number of load backers can also be operated in parallel in a gravity handler to increase the throughput. However, several test sockets can also be arranged among each other, which are operated by several lead backers in just a single guide. In order to fill the lead backer, the lowermost lead backer is in the feeding position, while the lead backers arranged above the latter are in the ejecting position. In this way, an electronic component released from the separating device slides until into the lowermost lead backer, and only there is stopped by the stopper pins.

After the lowermost lead backer has been filled, the lead backer situated above it is moved into the feeding position. This makes it possible to consecutively fill all lead backers, and then simultaneously test the corresponding number of electronic components. After the test, all lead backers return to the feeding position, and then one by one into the ejecting position from the bottom up, so that the tested electronic components are also ejected from the lead backers in this sequence.

In general, an enormous cost-based production advantage is obtained by configuring the lead backer 7 according to an embodiment of the invention with the simple, standardized mold for the ceramic supports 4, and in particular with the stopper pins 5 transferred in the attachment modules 3.

1 Lead backer
2 Base
3 Attachment module
4 Support
5 Stopper pin
6 Spacer plate
7 Coupling flange
8 Seam
9 Spring
10 Screw
11 Electronic component
12 Contact spring
13 Test spring
14 Test tip
15 Test socket
16 Load board
17 Contact socket
18 Retaining part
19 Stamp
20 Double arrow
21 Ejector
22 Centering bolt

The invention claimed is:

1. A guide and support member for a device for testing electronic components, which guide and support member can be moved into a feeding position and into a testing position, the guide and support member comprising:
   a base body for accommodating an electronic component to be tested,
   at least one support for supporting contact springs of the electronic component to be tested, and
   at least one stopper that stops movement of the electronic component to be tested at one of its contact springs once the electronic component to be tested is in an exact position, wherein the at least one support comprises a ceramic material and is inserted into a channel-shaped receptacle of an attachment module of the base body, and wherein the stopper is anchored in the base body.

2. The guide and support member as set forth in claim 1, wherein the base body comprises a base and at least one attachment module made from an electrically insulating plastic for the at least one support.

3. The guide and support member as set forth in claim 2, wherein the stopper is anchored in the at least one attachment module.

4. The guide and support member as set forth in claim 1, wherein the stopper is aligned so that the adjoining contact spring of the electronic component to be tested is supported by the at least one support.

5. The guide and support member as set forth in claim 2, wherein the at least one support is joined with the at least one attachment module in a positive fitting manner.

6. The guide and support member as set forth in claim 5, wherein the at least one support is adhesively bonded with the at least one attachment module.

7. The guide and support member as set forth in claim 5, wherein the positive fitting manner is established by means of two seams at diagonally opposing longitudinal edges of the at least one support and by means of springs of the at least one attachment module.

8. The guide and support member as set forth in claim 7, wherein the height of the seam is given larger dimensions than the height of the springs.

9. A guide and support member for a device for testing electronic components, which guide and support member can be moved into a feeding position and into a testing position, the guide and support member comprising:
   a base body for accommodating an electronic component to be tested,
   at least one support for supporting contact springs of the electronic component to be tested, and
   at least one stopper that stops movement of the electronic component to be tested at one of its contact springs once the electronic component to be tested is in an exact position, wherein the at least one support comprises a ceramic material and is inserted into a channel-shaped receptacle of an attachment module of the base body, wherein the stopper is anchored in the base body, and wherein the stopper is aligned so that the adjoining contact spring of the electronic component to be tested is supported by the at least one support.

10. The guide and support member as set forth in claim 9, wherein the base body comprises a base and at least one attachment module made from an electrically insulating plastic for the at least one support.

11. The guide and support member as set forth in claim 10, wherein the at least one support is joined with the at least one attachment module in a positive fitting manner.

12. The guide and support member as set forth in claim 11, wherein the at least one support is adhesively bonded with the at least one attachment module.

13. A guide and support member for a device for testing electronic components, which guide and support member can be moved into a feeding position and into a testing position, the guide and support member comprising:
- a base body for accommodating an electronic component to be tested,
- at least one support for supporting contact springs of the electronic component to be tested, and
- at least one stopper that stops movement of the electronic component to be tested at one of its contact springs once the electronic component to be tested is in an exact position, wherein the at least one support comprises a ceramic material and is inserted into a channel-shaped receptacle of an attachment module of the base body, wherein the stopper is anchored in the base body, and wherein the base body comprises a base and at least one attachment module made from an electrically insulating plastic for the at least one support, and
- wherein the at least one support is joined with the at least one attachment module in a positive fitting manner.

14. The guide and support member as set forth in claim 13, wherein the at least one support is also adhesively bonded with the at least one attachment module.

15. The guide and support member as set forth in claim 13, wherein the positive fitting manner is established by means of two seams at diagonally opposing longitudinal edges of the at least one support and by means of springs of the at least one attachment module.

16. The guide and support member as set forth in claim 15, wherein the height of the seam is given larger dimensions than the height of the springs.

\* \* \* \* \*